United States Patent [19]
Saltz et al.

[11] 4,357,656
[45] Nov. 2, 1982

[54] METHOD AND APPARATUS FOR DISABLING AND DIAGNOSING CACHE MEMORY STORAGE LOCATIONS

[75] Inventors: Warren L. Saltz, Marlboro; Anthony S. Vezza, Chelmsford, both of Mass.

[73] Assignee: Digital Equipment Corporation, Maynard, Mass.

[21] Appl. No.: 858,923

[22] Filed: Dec. 9, 1977

[51] Int. Cl.³ .................... G06F 9/30; G06F 13/06
[52] U.S. Cl. .................................................. 364/200
[58] Field of Search ... 364/200 MS File, 900 MS File; 371/21

[56] References Cited
U.S. PATENT DOCUMENTS

| | | | |
|---|---|---|---|
| 3,581,291 | 5/1971 | Iwamoto et al. | 364/200 |
| 3,675,215 | 7/1972 | Arnold et al. | 364/200 |
| 3,735,360 | 5/1973 | Anderson et al. | 364/200 |
| 3,771,137 | 11/1973 | Barner et al. | 364/200 |
| 3,829,840 | 8/1974 | Burk et al. | 364/200 |
| 3,845,474 | 10/1974 | Lange et al. | 364/200 |
| 3,848,234 | 11/1974 | MacDonald | 364/200 |
| 3,866,183 | 2/1975 | Lange | 364/200 |
| 3,896,419 | 7/1975 | Lange et al. | 364/200 |
| 4,047,160 | 9/1977 | Wolf | 364/900 |
| 4,051,461 | 9/1977 | Hashimoto et al. | 364/200 |
| 4,084,236 | 4/1978 | Chelberg et a. | 364/200 |
| 4,150,428 | 4/1979 | Inrig et al. | 364/200 |

*Primary Examiner*—Gareth D. Shaw
*Assistant Examiner*—Thomas M. Heckler
*Attorney, Agent, or Firm*—Arthur W. Fisher; Richard J. Paciulan

[57] ABSTRACT

In a data processing system having a main memory containing addressable main memory storage locations, and also having a processor with a cache memory containing addressable cache memory storage locations, signals representative of predetermined addressable cache memory storage locations desired to be intentionally disabled by an operator of the data processing system are compared with signals representative of an addressable main memory storage location being addressed by the processor during the execution of a program instruction. The data processing system is then caused to access the addressable main memory storage location when the signals representative of the predetermined addressable cache memory storage locations are in a predetermined fixed relationship with the signals representative of the addressable main memory storage location being addressed by the processor during the execution of the program instruction. When selected cache memory storage locations are thereby intentionally disabled, remaining enabled cache memory storage locations can be diagnosed by diagnostic program instructions which are loaded into main memory storage location by by-passing the selected cache memory storage locations. The enabled portions can then be tested by executing the diagnostic program instructions so loaded.

5 Claims, 6 Drawing Figures

METHOD AND APPARATUS FOR DISABLING AND DIAGNOSING CACHE MEMORY STORAGE LOCATIONS

BACKGROUND OF THE INVENTION

1. Field of the Invention

This invention relates generally to data processing systems and more specifically to a data processing system having a cache memory.

2. Description of the Prior Art

A cache memory is a small, high speed memory that maintains a copy of previously selected portions of main memory for faster re-access to instructions and data. The computer system, using a cache memory, appears the same as a conventional system with main memory, except that execution of programs is noticeably faster because the cache memory is synchronized with the processor and eliminates the longer bus transmission and access times associated with main memory.

Cache memories are well known in the art and were developed from an evaluation of the statistics of program behavior. More specifically, the principle of program locality states that programs have a tendency to make the most accesses or entries in the neighborhood of locations accessed in the recent past. Programs typically execute instructions in straight lines comprising small loops or subroutines, with the next few accesses or entries probably occurring within a few word locations ahead of or behind the current location. A cache exploits this type of program behavior by keeping copies of the recently used words.

A cache, then, is a small block of high speed memory utilized in conjunction with main memory. All of the data is stored in main memory and a copy of some of the data is stored in cache. If, for the most part, the needed data is in the cache or fast memory, the program will execute quickly, slowing down only when accesses must be made to main memory. The primary concern then is instruction execution speed. This is determined by the speed of the cache memory and the main memory and the frequency with which memory references find the data in the cache (hits) by comparison with the number of times the data is not in cache (misses).

The testing of a cache memory is a different task due to its transparency to the programmer and due to the fact that it is an integral part of the operating system. Part of the problem is solved by the utilization of a hit status register which monitors and stores the outputs of hit/miss circuitry providing a record of whether recent memory references were accessed in cache or in the main memory.

However, because the cache is a fundamental part of the operating system, it must be used to diagnose itself. In the past, this has forced the diagnostic programmer to execute instructions out of a possibly bad cache. Typically, in order to avoid this problem, the programmer had the ability to disable or "force misses" in all of the cache memory. However, this hardward feature did not realistically solve the problem for a small, economical system having a relatively small cache (such as, for example 1024 words) since the diagnostic programmer is forced to straight line code his test so that no instructions are executed out of cache. In terms of a small, economic system having a limited amount of main memory, and in light of all the different tests and patterns which must be performed to diagnose each location in the cache, the program size becomes exorbitant. More specifically, there is typically insufficient storage space in the main memory to economically accommodate this procedure.

Thus, as data processing systems become smaller and more economical, an inexpensive and effective method is needed to diagnose the cache and which permits the disablement of a faulty portion of the cache while the remainder of the cache continues to operate as an integral part of the data processing system.

SUMMARY OF THE INVENTION

Apparatus is disclosed herein for controlling and diagnosing a cache memory used in the data processing system. The present invention when coupled to the hit/miss circuitry of the cache memory can be utilized to force a "miss" output from this circuitry thus bypassing the cache for a particular memory access. The output of the logic circuitry is a function of addresses accessed on the cache memory address lines and the contents of a cache control register which is loaded with data from the processor and which may be utilized to force a miss output from the hit/miss circuitry for all of the cache memory addresses, a portion of the cache memory addresses or none of the cache memory addresses depending on the data stored in the cache control register.

To diagnose the cache, the cache control register may be loaded with data which will disable (ie, force "miss" outputs from the hit/miss circuitry) for a fractional portion of the cache memory addresses. A diagnostic program is then executed in which instructions are given addresses for the disabled portion of the cache so that they will be stored in main memory while test data is given addresses in the operating portion of the cache so that they may be manipulated to test this portion of the cache. When used in conjunction with the hit status register, the still-enabled portion of the cache may be diagnosed to determine if it is operating properly. This permits the diagnostic programmer to write substantially shorter diagnostic programs using loops, etc., instead of straight line code which was required in the prior art where all of the cache was disabled. Additionally, if a section of cache is determined to be faulty, the present invention permits the fractional portion of the cache memory including the faulty portion to be disabled while allowing the remainder of cache to be used normally thereby reducing the amount of performance degradation in the data processing system resulting from a faulty cache.

Finally, the present invention may be incorporated simply and economically since, at most it requires one chip. Additionally, incorporation of the present invention in a data processing system having a cache memory does not in any manner slow down the cache memory access time so that during normal operation there is no degradation of the data processing system's performance in terms of execution speed as a result of the incorporation of this invention.

DESCRIPTION OF THE PREFERRED EMBODIMENT

Figure 1:
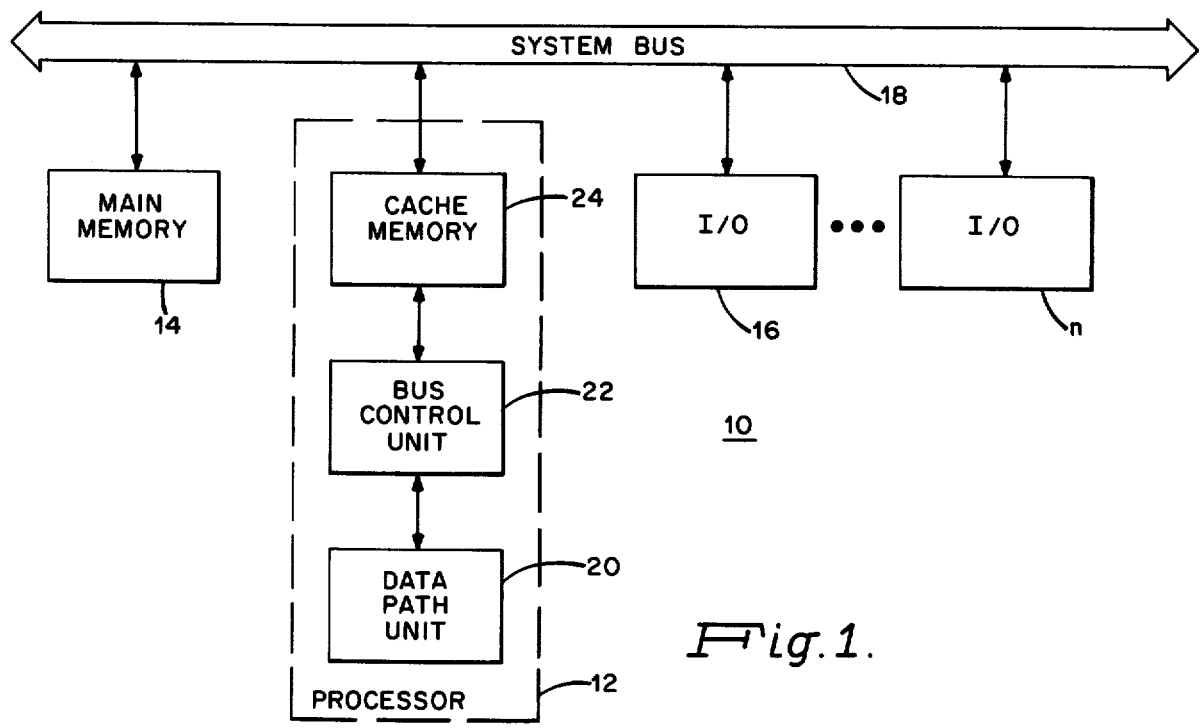
FIG. 1 is a block-schematic diagram of a simple data processing system and, in particular, depicting the physical locations of the cache memory and the main memory therein.

Referring now to FIG. 1, a simplified physical block diagram of a data processing system 10 is depicted. The data processing system 10 is comprised of a processor 12, a main memory 14 and a plurality of input/output (I/O) devices such as I/O device 16, all of which are interconnected by a system bus 18.

Figure 2:
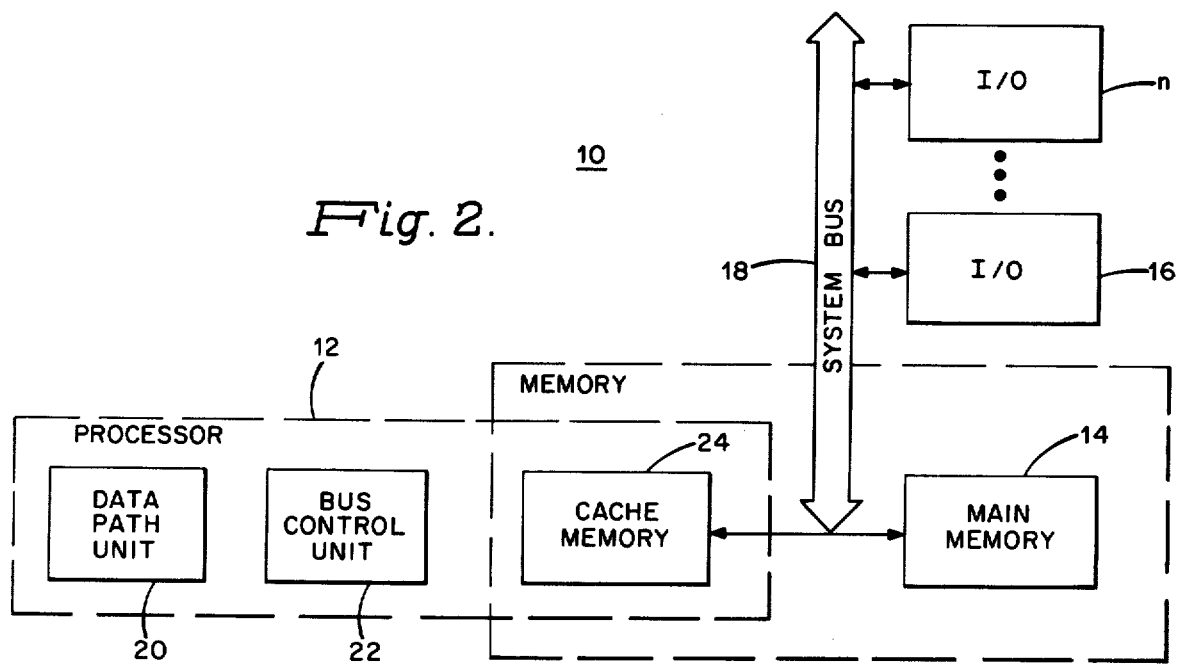
FIG. 2 is a block-functional diagram of the data processing system in FIG. 1 in which the operation of the cache memory is depicted in terms of functionality.

As depicted in FIG. 1, the processor 12 is physically comprised of a data path unit 20, a bus control unit 22, and a cache memory 24. The cache memory 24 is a small, high-speed memory that maintains a copy of the information stored in locations of the main memory 14 recently selected or addressed by the processor for fast reaccess to this information. Thus, although the cache memory is physically located within the processor 12, it may be functionally represented as a part of the main memory 14 as depicted in FIG. 2 in block-diagram form.

As earlier noted, the present invention may be utilized in conjunction with any cache memory. It should be understood than that the particular cache memory described below for the purposes of illustrating the preferred embodiment of the present invvention is merely an example, and that the present invention may be incorporated for use with cache memories of various types and sizes.

Figure 3:
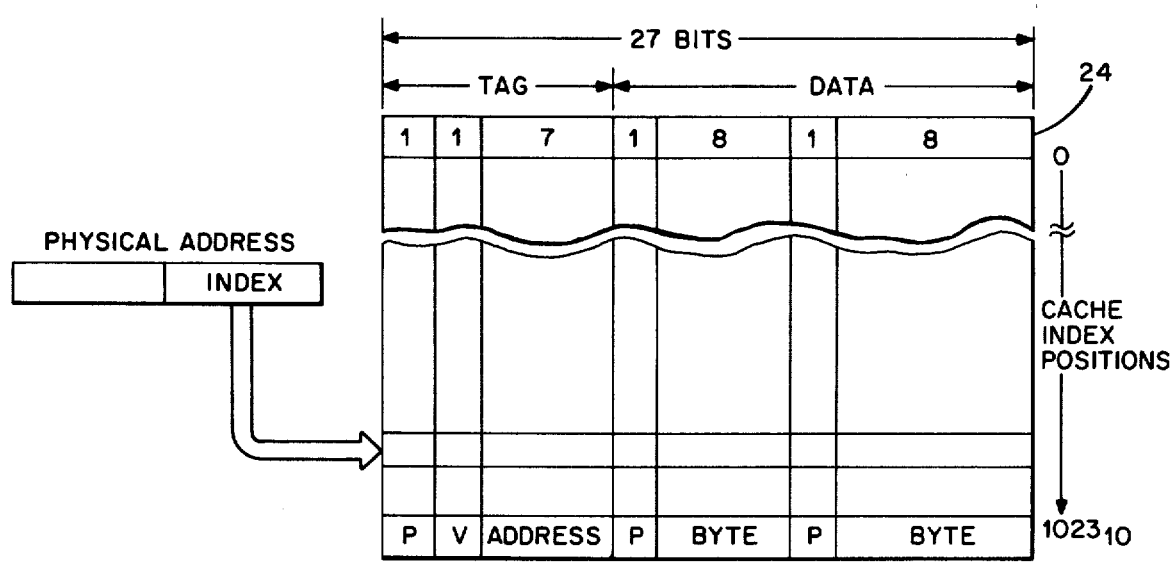
FIG. 3 is a graphical illustration of the physical arrangement of the cache memory in a typical data processing system.

The cache 24 shown in greater detail in FIG. 3 is a high-speed memory having a relatively small storage capacity with respect to the main memory 14; such as, for example, a capacity of 1,024 or 1 K words and which utilizes a direct mapping address mechanism. Utilization of direct mapping addressing means that each storage location in main memory is allowed only one possible location for storage in the cache 24. Consequently, only one address comparison is required to determine if the main memory location addressed is stored in the cache 24, whereas a fully associative cache would require several address comparisons. Since direct mapping addressing is utilized and the cache memory 24 capacity is 1 K, main memory is therefore divided into blocks of 1 K capacity. Thus, if the data processing system has a main memory capacity of 128 K words, the main memory will be divided, for the purposes of mapping into the cache, into 128 1 K blocks. Additionally, for the purposes of illustrating the preferred embodiment, the data processing system herein is defined as one having a block-size-transfer of one word. Thus, each time a main memory fetch or read occurs, only one word will be retrieved from memory.

Referring now to FIG. 3, the addressing mechanism of the cache memory 24 is depicted. Each of the 1 K storage locations in the cache memory 24 is utilized to store a word comprised of a number of bits which, for example, is depicted in FIG. 3 as 27. As shown in FIG. 3, each word of storage in the cache memory 24 is divided into two fields, a tag field and a data field. The data field is comprised of two eight bit bytes of data, each of which has an additional parity bit. The tag field is comprised of seven address bits, a parity bit and a valid bit. The valid bit is used to prevent a cache memory access when the information contained in a particular cache storage location is invalid, such as, for example, when the data processing system is first turned on or initialized or when an I/O device, such as, for example, a disk or other DMA (Direct Memory Access) peripheral device has changed the contents of a storage location in main memory which is presently mapped or stored in the cache so that the information in the cache is stale; that is, it no longer corresponds to that contained in the main memory location.

Figure 4:
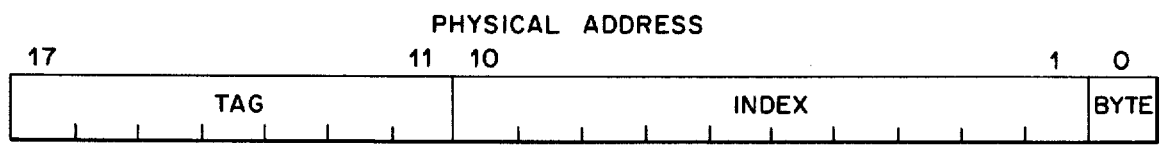
FIG. 4 is an illustration of a physical address format of the address mechanism used in the data processing system to access a memory location.

Because the cache memory 24 of the preferred embodiment utilizes a direct mapping address mechanism, the physical address of any memory access is divided into a tag field, an index field and a byte field as shown in FIG. 4. The byte field selects the high or low byte in the main memory and/or cache 24 for accessing. The index field is used for the purposes of the cache memory 24 to determine which cache index position, if any, will be accessed for retrieving or storing data. As shown in FIGS. 3 and 4, the 10-bit index field specifies one of 1,024 of 1 K index values and thus comprises the address of the 27-bit word location in the cache memory 24.

As earlier described, each storage location in the main memory has only one possible storage location or index in the cache memory where it may be stored. This means that any storage or index location in the cache memory 24 will be utilized to map one storage location in each 1 K block of main memory (i.e., 128). Thus, for example, the third storage or index location in the cache 24 will be utilized for the third storage location in each of the 128 K blocks in main memory 14. Since each cache index position may be utilized to store one of 128 memory locations, the tag field shown in FIG. 3 above for each cache index position is utilized to indicate which of the 128 K blocks in main memory is presently duplicated in the cache index position accessed. Accordingly, the tag field of the physical address shown in FIG. 4 is utilized to indicate which of the 128 1 K blocks is being accessed.

The cache memory, then, is addressed by utilizing the index field of the physical address to access a particular cache index position and by checking the higher order bits of the physical address (the tag field) with the tag field contained in the particular cache index location accessed. If the tag field in the physical address matches the tag field stored with the data in the particular cache index word accessed by the index field of the physical address, then, the contents of memory address specified in the physical address are contained in the cache memory and, in the case of a read or fetch, may be obtained directly from the cache 24.

When a match, as described above, occurs, the system designates it as a "hit". In the case of a read or fetch cycle from the processor, the data may be obtained directly from the cache. In this case, there is no need for utilizing a bus cycle over the system bus 18 in FIG. 1 to obtain the data from main memory. Since the cache memory can be accessed much faster than main memory, a significant savings in time is realized.

In the event that the tag fields do not match, a "miss" is said to have occurred. In this case, a bus cycle is initiated over the system bus 18 to obtain the data in the memory location specified by the physical address, when the data is retrieved, it will be stored in the data path unit 20 for processing by the system 10 and, additionally, stored in the cache index memory location specified for the physical address which has been read.

If a processor instruction requires data to be stored or loaded into a particular memory location, both the cache and the main memory location will be updated with this new data as will be explained hereinafter. Thus, a bus cycle over the system bus 18 is required for a "write command" irrespective of whether or not the particular memory location is presently stored in the cache memory 24. (The processor, however, can be arranged so that certain instructions which specify a write operation can be included wherein both the main memory location and cache memory location are written when a "hit" occurs and wherein only the main memory location is written when a "miss" occurs. For the purposes of this application, however, it will be assumed that both the main memory and the cache are written during all write operations.) Nevertheless, utilization of the cache represents a significant savings in terms of time since the number of memory references in a typical program executed by the processor will be comprised of approximately 10% write operations and 90% read or fetch operations, and more than 70% of the read or fetch operations will typically result in a "hit" as defined above for a cache memory used in this manner.

Figure 5:
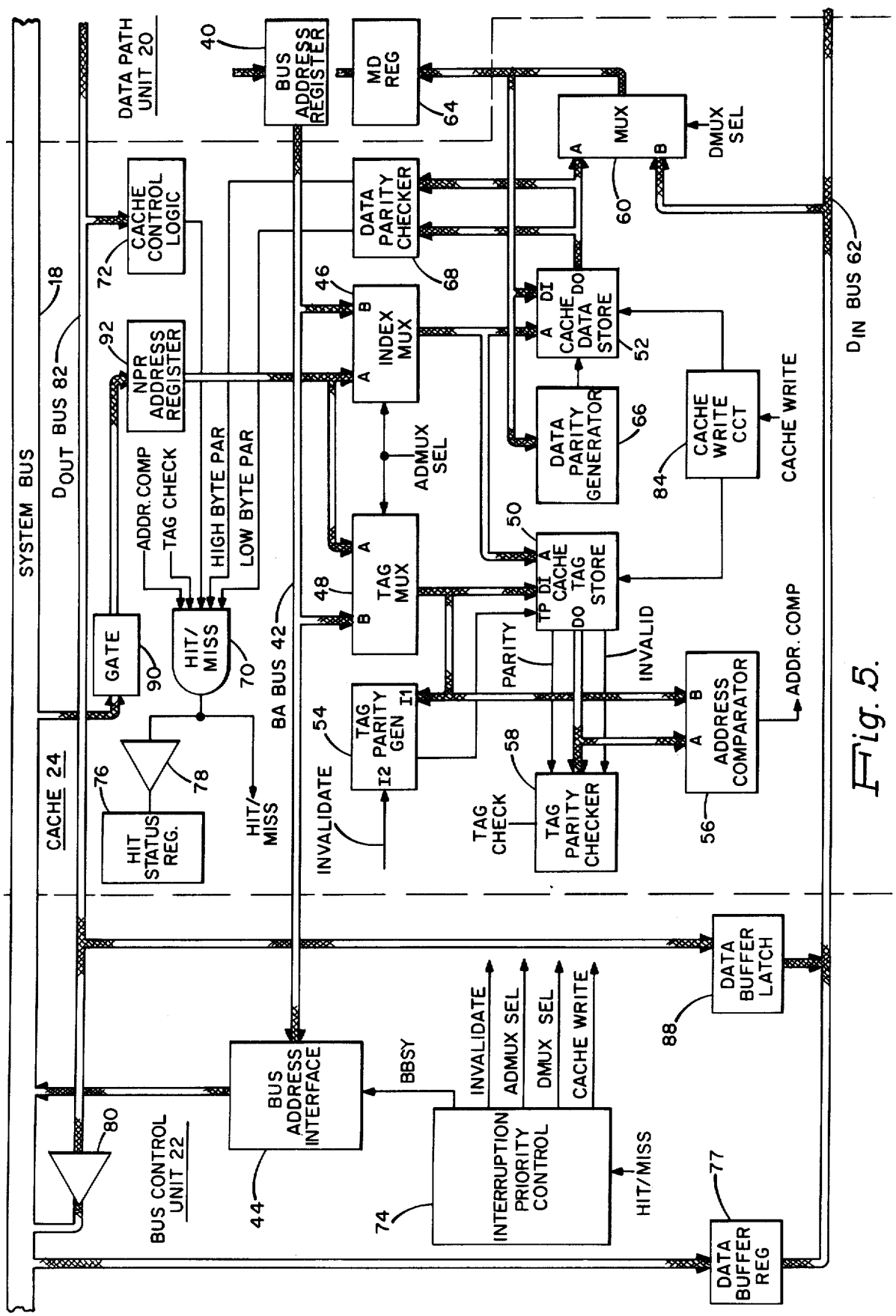
FIG. 5 is a block-schematic diagram of the processor of the data processing systtem depicting, in particular, the cache memory and portions of the data unit and bus control unit.

Referring now to FIG. 5, a block diagram of the processor 12 of the data processing systems is shown. In particular, FIG. 5 depicts a block diagram of the cache memory 24 in addition to partial block-diagrams of the bus control unit 22 and the data path unit 20. The operation of the processor 12 of the preferred embodiment of the present invention operates in a manner similar to that described in co-pending U.S. Pat. Application, Ser. No. 776,331, now U.S. Pat. No. 4,259,718 entitled "An Improved Processor For a Data Processing System" filed on Mar. 10, 1977, in the name of Charles H. Kaman, et al and assigned to the Assignee of the present invention and which is incorporated herein by reference.

The physical address of the memory location to be accessed in the execution of a processor instruction is loaded into the bus address register 40. A BA bus 42 couples the output of the bus address register 40 through the cache memory unit 24 to the system bus 18 interface unit 44 in the bus control unit 22. Since, in the preferred embodiment of the present invention, the physical address of any memory location is comprised of 18 bits as specified in FIG. 4, the BA bus 42 is comprised of 18 conductors, each of which electrically conducts a particular bit of the physical address being accessed.

In the cache 24, the BA bus 42 is coupled to an index multiplexer 46 and a tag multiplexer 48. More specifically, the index multiplexer 46 is connected to those conductors of the BA bus 42 to which the index field bits of the physical address are coupled. Similarly, the tag multiplexer 48 is connected to those conductors of the BA bus 42 onto which the tag field bits of the physical address are coupled.

In FIG. 3, the cache memory is depicted which is comprised of 1 K (1,024) or index locations. Each index location as shown in FIG. 3, is comprised of 27 bits divided into a tag field and a data field. Referring again to FIG. 5, it can be seen that each cache index location is partially contained in two memories, preferably high speed bi-polar memories, having duplicate addresses. More specifically, a cache tag store 50 is utilized to store the tag fields of each cache index location whereas a cache data store 52 is utilized to store the data field of each cache index location.

The output of the index multiplexer 46 is coupled to the address inputs (A) of both the cache tag store 50 and the cache data store 52. The output of the tag multiplexer 48 is coupled to the data input (DI) of the cache tag store 50, the input (I1) to a tag parity generator 54 and to an input (B) of an address comparator 56. The data output (DO) of the cache tag store 50 is coupled to a tag parity checker 58 and an other input (A) of the address comparator 56. Additionally, the output of the tag parity generator 54 is coupled to the tag parity input (TP) of the cache tag store 50.

Still referring to FIG. 5, the output of the cache data store 52 is coupled to the A input of a multiplexer 60. The B input of the multiplexer 60 is coupled to a Din bus which is utilized to transport data from the main memory or an I/O device over the system bus 18. The output of the multiplexer 60 is coupled to a general purpose input register (MD) 63 in the data path unit 20 and, additionally, to the data input (DI) of the cache data store 52 and the DI input of a data parity generator 66. The output of the data parity generator 66 is coupled to the parity inputs of the cache data store 52.

The output of the cache data store 52 is also coupled to a data parity checker 68 which checks the parity of any output retrieved from the cache data store 52. The outputs of the data parity checker 68 are coupled to inputs of a hit/miss logic circuit 70 along with the outputs from the address comparator 56, the tag parity checker 58, and a cache control logic circuit 72 which shall be described in greater detail hereinafter. The output of the hit/miss logic 70 is coupled to an interruption priority control circuitry 74 in the bus control unit 22, and to a hit register 76 through an inverter 78.

The hit status register 76 is utilized to maintain a record of the outputs from the hit/miss logic 70 for a plurality of consecutive memory references, and typically six.

The interruption priority control circuitry 74 in the bus control unit 22 in conjunction with a bus address interface 44 performs similar functions to the bus interface unit 36 and the interruption priority unit 38 described in U.S. Pat. No. 3,710,324 which is assigned to the assignee of the present application and is hereby incorporated by reference. Specifically, the interruption priority control circuit 74 generates and monitors the protocol described in the aforementioned patent between I/O devices, main memory 14 and the processor unit 12 connected to the system bus 18 and monitors priority levels of non-processor requests and processor requests from the various I/O devices coupled to the system bus 18. Additionally, the interruption priority control circuit generates a number of signals utilized to operate the cache which will be described in greater detail hereinafter. The bus control unit 22 also includes a data buffer register 77 and a data output gate 80. Data received by the processor 12 from an I/O device or main memory over the system bus 18 is coupled into the data buffer register 77 and thereafter onto the Din bus 62. Data to be transmitted onto the system bus 18 from the processor 12 is coupled from the data path unit 20 on to the Dout bus 82 and thereafter through the Dout gate 80 on to the system bus 18. Both the Dout gate 80 and the data buffer register 77 are controlled in part by the interruption priority control 74 and in part by microinstructions executed by the processor 12.

In operation, the data processing system executes memory references or accesses in the following manner. When a microinstruction in a microprogram being executed by the processor which specifies that a memory reference is issued by a control store (not shown), the bus address register 40, as previously mentioned, is loaded with the physical address of the memory location to be accessed. Memory references or accesses can be divided into two groups; namely, an operation in which data is retrieved or read from memory (DATI) and an operation during which data is stored or written into memory (DATO).

If a read or DATI operation is specified by the microinstruction issued by the control store, the index field of the physical memory address coupled onto the B/A bus 42 through the bus address register 40, is coupled through the index multiplexer 46 to the address inputs of the cache tag store 50 and the cache data store 52. Additionally, the tag field of the physical memory address coupled on to the B/A bus 42 is coupled through the tag multiplexor 48 to the B input of the address comparator 56. The tag field stored in the cache index location specified by the index field coupled to the address input of the cache tag store 50 is then coupled to the output of the cache tag store 50 and directed to the tag parity checker 58 and the A input of the address comparator 56. The tag parity checker checks the parity of the tag field coupled to the output of the cache tag store 50 with the parity bit contained therein and also checks the valid bit to ensure that the data contained in the index location accessed is not erroneous. Simultaneously the address comparator 56 compares the tag field of the physical memory address with the tag field coupled onto the output of the cache tag store 50.

In conjunction with the tag field parity check and tag field comparison, the contents of the cache index location in the cache data store 52 specified by the index field of the physical memory address is coupled to the output of the cache data store 52 and to the data parity checker 66 and the A input of the multiplexor 60.

The outputs of the tag parity checker 58, the address comparator 56 and the data parity checker 68 are coupled to the inputs of the hit/miss logic 70. If the outputs of the tag parity checker 58 and the data parity checker 68 all indicate proper parity and validity checks, and the address comparator output indicates that the tag field of the physical address matches the tag field stored in the cache index location access, then a hit output is generated by the hit/miss logic 70.

The hit output is recorded in the hit register 76 through gate 78 and is also coupled to the interruption priority control circuitry 74. Since a read or DATI operation has been specified, and the hit/miss logic output indicates that a hit has occurred (i.e., the data in the memory location specified by the physical address is located in the cache data store 52), the interruption priority control circuit will generate an output on the Dmux select bus such that the A input to the multiplexer 60 is selected for coupling to the output thereof and into the MD register of the data path unit 20.

The interruption priority control circuit in this instance will also fail to enable the system bus busy line (BBSY) thereby disabling or preventing the system bus interface unit 44 from coupling the memory address on the BA Bus 42 onto the address lines of the system bus 18. Accordingly, the data requested is retrieved from the index location accessed in the cache 24 without having to initiate a system bus 18 operation and in a period of time substantially less than would be required if the data had to be retrieved from main memory over the system bus.

In the event that main memory location reference is not mapped in the cache 24 (i.e., the data stored in the address specified by the physical address is not stored in the cache data store 52) the tag field of the physical memory address on the BA bus 42 and the tag field in the cache index location accessed by the index field will not match causing an output from the address comparator 56 which will generate a miss output signal from the hit/miss logic 70. Similarly, an error detected by the tag parity checker 54 in the tag parity or invalid bit detected thereby, or an error detected by the data parity checker 68 in the data outputs from the cache data store 52 will also cause a miss output to be generated by the hit/miss logic 70. In this case, the interruption priority control circuit 74 will enable the Dmux select output such that the B input to multiplexer 60 is selected for coupling to the output thereof. Additionally, the interruption priority control circuit 74 will enable the BBSY line thereby causing the system bus address interface unit 44 to couple the contents of the BA bus 42 onto the address lines of the system bus 18.

Thereafter, the data stored in the memory location specified by the physical memory address stored in the bus address register 40 is coupled via the data lines of the system bus 18 into the data buffer register 77. An output from the interruption priority control circuit 74 will enable the data buffer register 78 such that the output thereof is coupled onto the Din bus 62 through the multiplexer 60 and into the MD register 64 in the data path unit 20.

The output of the multiplexer 60 is also coupled to the data input terminals of the cache data store 52 and the data parity generator 66. The interruption priority control circuit 74 will also generate a cache write signal which is coupled to the write inputs of the cache tag store 50 and the cache data store 52 through the cache write signal circuitry 84 such that the cache tag store 50 and the cache data store 52 are written or loaded with the new tag field and new data respectively. In the case of the cache data store 52, the data at the output of the D multiplexer 60 will be written into the cache index location along with the high byte and low byte parity bits generated by the data parity generator 66. In the case of the cache tag store 50, the tag field of the physical memory address at the output of the tag multiplexer 48 will be written into the cache tag store 50 along with a tag parity bit and validity bit generated by the tag parity generator 54.

In the event that the microinstruction issued by the control store specifies a write or DATO operation, the operation of the cache will proceed in the manner similar to that described for the read of DATI operation in which the hit/miss logic 70 generates a miss output. This results because of the fact that the cache memory index location and its counterpart in the main memory must both be updated simultaneously so that both contain the new data. Accordingly, the interruption priority control circuitry will enable the bus address interface unit 44 such that the physical address on the BA bus 42 is coupled onto the address lines of the system bus 18. In this case, however, the data to be written is coupled from the data path unit 20 onto the Dout bus 82. Therefore, the interruption priority control unit will enable the Dout gate 80 so that the data is coupled onto the data lines of the system bus 18. Additionally, a data buffer latch register 88 is enabled by the interruption priority control circuit 74 such that the data contained in the Dout bus is coupled therethrough and onto the Din bus 62.

As in the case with a miss output during a DATI operation, the interruption priority control circuit 74 will select the B input to the multiplexer 60 so that the data coupled through the data buffer latch 88 on to the Din bus 62 is coupled to the output of the multiplexer 60 and thereafter to the DI input of the cache data store 52 and the data parity generator 66. In a manner similar to that specified for read or DATI operation in which the hit/miss logic generates a miss output, the cache tag store 50 and the cache data store 52 are written or loaded with the updated tag field and data respectively.

In the data processing system of the preferred embodiment, an I/O device is capable of communicating directly with the processor 12, main memory 14 or another I/O device. In the event that such an I/O device, which has gained control of the system bus 18, writes new data into a memory location which is presently duplicated or mapped in the cache, the data contained in the cache memory will become erroneous or "stale". To compensate for this, the address issued by such an I/O device on to the address lines of the system data bus 18 is coupled through a gate 90 and into a non processor request (NPR) address register 92. The output of the NPR address register 92, similar to the BA bus 42, is coupled to both the index multiplexer 46 and the tag multiplexer 48 so that the index field of the memory address is coupled to the index multiplexer 46 while the tag field of the memory address is coupled to the tag multiplexer 48.

Since the I/O device was granted control of the bus by the interruption priority control citcuit 74 in a manner set forth in the aforementioned U.S. Pat. No. 3,710,324, the interruption priority control circuit 74 will at the same time generate an output on the address multiplexer select lines (ADMUX SEL) such that the A inputs to the tag multiplexer 48 and the index multiplexer 46 are selected. Thus, the index field of the memory address issued by the I/O device is coupled to the address inputs of the cache tag store 50 and the cache data store 52 whereas the tag field of the memory address issued by the I/O device is coupled to the B input of the address comparator 56.

The tag field of the cache index location accessed by the index field is then coupled to the output of the cache tag store 50 and to the A input of the address comparator 56. If the tag field contained in the index location accessed in the cache tag store 52 matches the tag field of the address specified by the I/O device, and the parity checkers 58 and 68 indicate proper parity, the hit/miss logic 70 will generate a hit output. The hit output is coupled to the interruption priority control circuit 74 which will generate an output onto the invalidate line coupled to the tag parity generator 54.

In the same manner as previously described, the cache tag store 50 will be written with the output of the tag multiplexer 48 and a new parity bit. Also, the valid bit location will be written with an invalid bit. Thus, the next time this particular cache index location is accessed, a miss output will be generated by the hit/miss logic 70 due to the tag parity checker 58 output as a result of the invalid bit. Accordingly, a bus cycle over the data system bus 18 will follow to fetch the data from main memory. At this time, the cache data store 52 along with the cache tag store 50 will be properly rewritten with the appropriate data and tag field respectively.

As can be appreciated from the foregoing description, the operation of the cache memory comprises an integral part of the operation of the data processing system 10. In attempting to diagnose the cache memory system, it is desirable to do so in as short a time as possible. In an economical system having a relatively small memory, such as for example in the present case having 128 K words in the main memory, it is important to have a diagnostic program which requires as little of the main memory storage space as possible since there may be very little available for such usage. It is also desirable to reduce the degradation of the system when a portion of the cache becomes faulty or inoperative by enabling parts of the cache which are known to be operating properly to continue to operate while the faulty portions are disabled. The present invention provides these capabilities and does so very simply and inexpensively in terms of chips or elements to accomplish this and the physical space consumed thereby.

Figure 6:
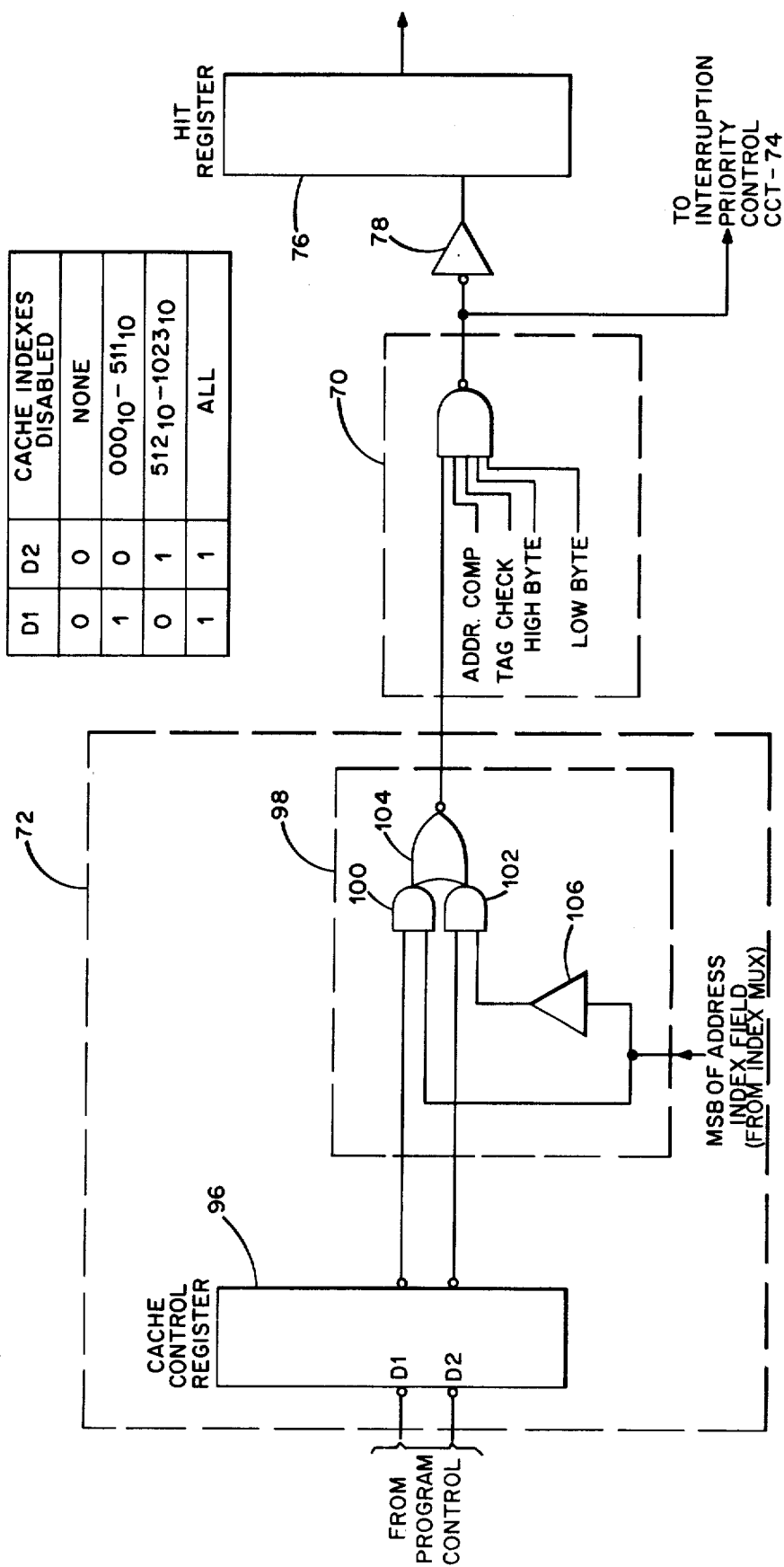
FIG. 6 is a schematic diagram illustrating the present invention as incorporated in the cache memory of a data processing system.

Referring again to FIG. 5, a cache control circuitry 72 is shown having an input coupled to the Dout bus 82 and an output coupled to the hit/miss logic 70. The cache control circuitry as depicted in FIG. 6 is comprised of a cache control register 96 and control logic circuitry 98. As depicted in FIG. 6, the cache control register 96 is comprised of at least two storage bit locations D1 and D2 which can be written or loaded under the control of a microinstruction with four possible combinations of data as shown in the table in FIG. 6.

The control logic 98, as depicted in FIG. 6, is comprised of two AND gates 100 and 102, the output of each of which is coupled to an input of a NOR gate 104. As will become apparent from the ensuing discussion of the cache control logic 98, the embodiment of the cache control logic circuitry 98, shown in FIG. 6, is only one of many configurations that may be used to perform the logic function of the cache control logic circuitry 98.

The contents of one of the storage bit locations of the cache control register 96 are coupled to an input of AND gate 100, while the contents of the other storage bit location of the cache control register 96 are coupled to an input of AND gate 102. The remaining inputs to AND gates 100 and 102 are coupled to an individual output of the index multiplexer 46 containing the most significant bit (MSB) of the index field of the physical address for the memory location being addressed. The value of the MSB of the index field is inverted through an inverter gate 106 prior to coupling directly to the input of AND gate 102. Additionally, the output of the cache control logic circuitry 98, that is, the output of NOR gate 104, is coupled to an input of the hit/miss logic 70.

As previously described, the cache memory 24 for the purposes of explaining the preferred embodiment of the present invention has been defined as having 1 K or one thousand and twenty-four index or storage locations. Accordingly, as shown in FIG. 4, an index field of at least 10 binary bit locations is required to separately identify each of the one-thousand and twenty-four index or memory locations. In FIG. 4, bit position 10 of the index field is defined as the MSB, whereas bit position 1 is defined as the least significant bit (LSB). Typically, the MSB for index locations $000_{10}$ through $511_{10}$ will be a binary zero, whereas for cache index positions $512_{10}$ through $1023_{10}$, the value of the MSB will be a binary 1.

Referring to the table in FIG. 6, it can be seen that the contents of the storage bit locations in the cache control register 96 may be selected such that an output from the cache control logic may be generated which will force a miss output from hit/miss logic 70 when (i) any one of the first 512 cache memory index locations is addressed; (ii) any one of the last 512 cache memory index locations is addressed; or (iii) any one of all 1024 cache memory index locations is addressed. Additionally, by selecting the correct contents for storage in the cache control register, the inputs to AND gates 100 and 102 of the cache control logic circuitry 98 can be conditioned such that none of the 1024 cache memory index locations are affected by the present invention as shown in the table in FIG. 6 for the condition where both storage locations in the cache control register 96 are loaded with a binary 0.

As previously noted, the present invention is useful in diagnosing the operation of the cache memory. Specifically, in order to diagnose or analyze the proper operation of a half of the cache memory 24, the index locations comprising the remaining half of the cache may be disabled, that is, miss outputs may be forced from the hit/miss logic 70 each time an index field specifying an index location in the disabled half of the cache 24 is contained in the bus address register 40. The diagnostic programmer may then execute a program in which the instructions for diagnosing the cache are all provided with index addresses in the disabled half of the cache such that these instructions bypass the cache and are loaded into the main memory or backing store. Additionally, test data that will be used to test the operation of half of the cache memory being diagnosed will be given addresses with index fields in the still-operative half of the cache memory. In this manner, the test data can be manipulated by the diagnostic instructions such that the entire operating half of the cache memory is properly diagnosed.

During the diagnosis, the test data, as earlier explained, will be written into both the operative half of the cache index locations and their counterparts in the main memory. Thereafter instructions will be executed by the data processing system which will require DATI operations out of the enabled portions of the cache memory. Subsequently, the contents of the hit/miss register which stores the results of the hit/miss logic 70 for the most recent plurality of cache operations) can be examined to determine if the operative half of the cache locations are operating properly, since as earlier described a hit output will not be generated by the hit/miss logic 70 for any cache memory read or DATI operation unless there is a proper output from the address comparator, the tag parity checker, and the high and low byte data parity checkers.

By disabling a portion of the cache at a particular time, the diagnostic programmer may write a program of substantially shorter length making use of loops or recurring subroutines as opposed to straight-line code which was required in the past when all of the cache would be disabled for diagnostic purposes. Additionally, because the diagnostic program is now substantially shorter, the cache may be used in a more economical system where the memory capacity is limited since the total backup memory capacity for executing the diagnostics for systems incorporating the present invention will be substantially less than a system in which all of the cache must be disabled for diagnostic purposes.

In the event that the diagnosis of the cache reveals that one or more cache index locations are operating improperly, the half of the cache memory index locations containing these index locations may be disabled while the remaining half continues to operate in the normal manner. By permitting the continued use of the half of cache operating properly, the amount of system degradation as a result of a cache malfunction is substantially reduced.

From the foregoing description of the present invention it can be appreciated that the present invention may be incorporated into a cache memory in a manner to permit smaller portions of the cache to be disabled. For example, by including an additional storage bit in the cache control register, by providing a slightly different logic arrangement in the cache control logic circuitry 98 and by examining both the MSB and the next most significant bit of the index field of the physical memory address, the cache memory may be diagnosed and/or disabled in quarters as opposed to halves as described above.

The present invention may be embodied in a single chip for incorporation into any data processing system thus resulting in an inexpensive means of providing the above-mentioned features. Additionally, the invention operates asynchronously with normal cache memory operations so that no extra time is consumed during normal operation of the processor as a result of incorporating the present invention therein.

While the invention has been described in its preferred embodiment, it is to be understood that the words which have been used are words of description rather than limitation and that changes may be made within the purview of the appended claims without departing from the true scope and spirit of the invention in its broader aspects.

We claim:

1. In a data processing system having at least a main memory containing a plurality of addressable main memory storage locations and a processor for executing program instructions utilized to control the operation of the data processing system, said processor having a cache memory containing a plurality of addressable cache memory storage locations, said cache memory capable of comparing signals representative of address information indicative of an addressable main memory storage location addressed by the processor during execution of a program instruction with signals representative of address information indicative of an addressable cache memory storage location addressed by the processor during the execution of a program instruction for determining whether the data processing system would access the addressable main memory storage location or would access the addressable cache memory storage location, a method for disabling predetermined ones of said plurality of addressable cache memory storage locations comprising the steps of:

(a) generating signals representative of predetermined ones of said plurality of addressable cache memory storage locations intentionally desired to be disabled by an operator of the data processing system;

(b) comparing said signals representative of said predetermined ones of said plurality of addressable cache memory storage locations with signals representative of an addressable main memory storage location being addressed by the processor during the execution of a program instruction; and (c) causing said data processing system to access said addressable main memory storage location being addressed by the processor during the execution of a program instruction when said signals representative of said predetermined ones of said plurality of addressable cache memory storage locations are in a predetermined fixed relationship with said signals representative of the addressable main memory storage location being addressed by the processor during execution of a program instruction, thereby intentionally disabling said predetermined ones of said plurality of addressable cache memory storage locations.

2. In a data processing system having at least a main memory containing a plurality of addressable main memory storage locations and a processor for executing program instructions utilized to control the operation of the data processing system, said processor having a cache memory containing a plurality of addressable cache memory storage locations, each storage location identified by an index address, said cache memory capable of comparing signals representative of an address of an addressable main memory storage location addressed by the processor during execution of a program instruction with signals representative of address information indicative of an addressable cache memory storage location addressed by the processor during the execution of a program instruction for determining whether the data processing system would access the addressable main memory storage location or would access the addressable cache memory storage location, a method for diagnosing the operation of addressable cache memory storage locations comprising the steps of:

(a) intentionally disabling predetermined ones of said plurality of addressable cache memory storage locations, leaving remaining addressable cache memory storage locations desired to be diagnosed by an operator of the data processing system enabled;

(b) creating diagnostic program instructions capable of being executed by said processor and having index addresses identifying said addressable cache memory storage locations desired to be diagnosed;

(c) loading said diagnostic program instructions into ones of said plurality of addressable main memory storage locations by by-passing said disabled predetermined ones of said plurality of addressable cache memory storage locations; and (d) testing said enabled locations of said addressable cache memory storage locations by executing said diagnostic program instructions stored in said addressable plurality of main memory storage locations.

3. The method for diagnosing the operation of addressable cache memory storage locations of claim 2 wherein the step of intentionally disabling predetermined addressable cache memory storage locations further comprises the steps of:

(a) generating signals representative of predetermined ones of said plurality of addressable cache memory storage locations intentionally desired to be disabled by an operator of the data processing system;

(b) comparing said signals representative of said predetermined ones of said plurality of addressable cache memory storage locations with signals representative of an addressable main memory storage location being addressed by the processor during the execution of a program instruction; and (c) causing said data processing system to access said addressable main memory storage location being addressed by the processor during the execution of a program instruction when said signals representative of said predetermined ones of said plurality of addressable cache memory storage locations are in a predetermined fixed relationship with said signals representative of the addressable main memory storage location addressed by the processor during execution of a program instruction, thereby intentionally disabling said predetermined ones of said plurality of addressable cache memory storage locations.

4. In a data processing system having at least a main memory containing a plurality of addressable main memory storage locations and a processor for executing program instructions utilized to control the operation of the data processing system, said processor having a cache memory containing a plurality of addressable cache memory storage locations, said cache memory also having hit/miss logic circuitry capable of comparing signals representative of an addressable main memory storage location addressed by the processor during execution of a program instruction with signals representative of address information indicative of an addressable cache memory storage location addressed by the processor during the execution of a program instruction for determining whether the data processing system would access the addressable main memory storage location or would access the addressable cache memory storage location, cache control logic means for disabling predetermined ones of said plurality of addressable cache memory storage locations comprising:

(a) means to generate signals representative of the predetermined ones of said plurality of addressable cache memory storage locations intentionally desired to be disabled by an operator of the data processing system; and (b) signal comparison means, receptive of said signals representative of said predetermined ones of said plurality of addressable cache memory storage locations and signals representative of an addressable main memory storage location being addressed by the processor during the execution of a program instruction, coupled to said cache memory hit/miss logic circuitry and capable of developing an output signal which causes said data processing system to access said addressable main memory storage location being addressed when said signals representative of said predetermined ones of said plurality of addressable cache memory storage locations are in a predetermined fixed relationship with said signals representative of the addressable main memory storage location being addressed by the processor during the execution of a program instruction.

5. The cache control logic means of claim 4 wherein said means to provide signals representative of predetermined ones of said plurality of addressable cache memory storage locations intentionally desired to be disabled by an operator of the data processing system comprises a register for storing digital information in response to defined program instructions executed by the processor whereby said digital information corresponds to the predetermined ones of said plurality of addressable cache memory storage locations desired to be disabled.

* * * * *